(12) United States Patent
Holcombe

(10) Patent No.: US 6,169,765 B1
(45) Date of Patent: Jan. 2, 2001

(54) APPARATUS AND METHOD FOR OUTPUT SIGNAL PULSE WIDTH ERROR CORRECTION IN A COMMUNICATIONS RECEIVER

(75) Inventor: Wayne T. Holcombe, Palo Alto, CA (US)

(73) Assignee: Integration Associates, Inc., Mountain View, CA (US)

( * ) Notice: Under 35 U.S.C. 154(b), the term of this patent shall be extended for 0 days.

(21) Appl. No.: 08/864,286

(22) Filed: May 28, 1997

(51) Int. Cl.[7] ......................................................... H03K 7/08
(52) U.S. Cl. .......................... 375/238; 375/239; 370/212; 370/213; 329/312; 329/313; 332/109; 332/112; 327/26; 327/35; 327/37
(58) Field of Search ..................................... 375/238, 239, 375/353; 370/212, 213; 329/312, 313, 314; 332/109, 110, 112, 113; 327/26, 31, 33, 35, 36, 37

(56) References Cited

U.S. PATENT DOCUMENTS

| | | | | |
|---|---|---|---|---|
| 3,619,660 | * | 11/1971 | Rugo ....................................... | 327/332 |
| 4,001,775 | * | 1/1977 | Sexton et al. ........................... | 367/83 |
| 4,241,455 | * | 12/1980 | Eibner ..................................... | 455/600 |
| 4,528,519 | * | 7/1985 | van Driest .............................. | 330/279 |
| 4,757,502 | * | 7/1988 | Meuriche et al. ...................... | 370/104 |
| 5,081,653 | * | 1/1992 | Saito ........................................ | 375/98 |
| 5,329,115 | * | 7/1994 | Lim ......................................... | 327/514 |

(List continued on next page.)

OTHER PUBLICATIONS

Ernesto Perea "Technology Directions; Optical Interconnects, High Temperature, & Packaging" Feb. 10, 1996, ISSCC96, 8 pages.*
IBM Microelectronics "Infrared Transceiver Module—IBM31T1101" Nov. 6, 1996, http:///www.chips.ibm.com.*
Temic Semiconductors "TFDS 6000 Integrated Infrared Transceiver Module IrDA" Aug. 1996, 12 pages.*
Hewlett–Packard "Infrared Transceiver Preliminary Technical Data HSDL–1100" Nov. 17, 1995.*
Novalog, Inc. "SIRFIR™ 4Mbps IrDA Transceiver" Apr. 1996 info@novalog.com.*
Dr. Keming W. Yeh and Dr. Lichen Wang "An Introduction to the IrDA Standard and System Implementation" Wireless System Design May 1996, 11 pages.*
Temic Semiconductors "IrDA Compativle Data Transmission" Apr. 1996, pp. 1–18.*

*Primary Examiner*—Young T. Tse
(74) *Attorney, Agent, or Firm*—Vernon W. Francissen; McDonnell Boehnen Hulbert & Berghoff

(57) ABSTRACT

An output signal pulse width error correction circuit and method wherein errors in a data signal conforming to a communications protocol having a prescribed duty cycle are corrected by monitoring a duty cycle of the data signal, comparing the duty cycle to a duty cycle reference voltage corresponding to the prescribed duty cycle, and adjusting a pulse width of the data signal to conform to the prescribed duty cycle of the protocol. An embodiment is shown that low pass filters the input data signal to introduce greater slope to the input data signal which is then compared to a pulse width control voltage in order to generate an output data signal. The pulse width control voltage is produced by integrating the output data signal to obtain an average value corresponding to the duty cycle of the output data signal and comparing the average value to a duty cycle reference voltage corresponding to the prescribed duty cycle for the communications protocol. Another embodiment directed toward an integrated circuit implementation is shown that converts the input data signal into complementary input data current signals, using current mirror circuits, which are used to drive complementary variable delay circuits. The pulse width control voltage is also converted into complementary error current signals which adjust the duty cycle of output data signal by controlling the variable delay circuits.

7 Claims, 4 Drawing Sheets

U.S. PATENT DOCUMENTS

| | | | | |
|---|---|---|---|---|
| 5,361,395 | * | 11/1994 | Yamamoto | 455/33.2 |
| 5,532,918 | * | 7/1996 | Mayrand et al. | 363/89 |
| 5,557,634 | * | 9/1996 | Balasubramanian | 375/222 |
| 5,585,952 | * | 12/1996 | Imai et al. | 359/135 |
| 5,686,768 | * | 11/1997 | Thomsen et al. | 307/64 |
| 5,760,942 | * | 6/1998 | Bryant | 359/193 |
| 5,811,999 | * | 9/1998 | Hall et al. | 327/156 |
| 5,859,506 | * | 1/1999 | Lemke | 315/308 |
| 6,038,049 | | 3/2000 | Shimizu et al. | 259/189 |

* cited by examiner

APPARATUS AND METHOD FOR OUTPUT SIGNAL PULSE WIDTH ERROR CORRECTION IN A COMMUNICATIONS RECEIVER

BACKGROUND OF THE INVENTION

The present invention relates to an output signal pulse width error correction circuit and method wherein the duty cycle of a digital output signal produced in response to an input signal is normalized such that the digital output signal conforms to a predetermined communications protocol.

Infrared wireless data communication is a useful method for short range (in the approximate range of 0–10 meters) wireless transfer of data between electronic equipment; such as, cellular phones, computers, computer peripherals (printers, modems, keyboards, cursor control devices, etc.), electronic keys, electronic ID devices, and network equipment. Infrared wireless communication devices typically have the advantages of smaller size, lower cost, fewer regulatory requirements, and a well defined transmission coverage area as compared to radio frequency wireless technology (i.e. the zone of transmission is bounded by physical walls and therefore more useful in an office environment). In addition, infrared wireless communication has further advantages with regard to reliability, electromagnetic compatibility, multiplexing capability, easier mechanical design, and convenience to the user as compared to cable based communication technology. As a result, infrared data communication devices are useful for replacing 0–10 meter long data transfer cables between electronic devices, provided that their size and costs can be reduced to that of comparable cable technology.

Infrared data communications devices typically consist of transmitter and receiver components. The infrared data transmitter section consists of one or more infrared light emitting diodes (LEDs), an infrared lens, and an LED current driver. A conventional infrared data receiver typically consists of an infrared photodiode and a high gain receiver amplifier with various signal processing functions, such as automatic gain control (AGC), background current cancelling, filtering, and demodulation. For one-directional data transfer, only a transmitter at the originating end and a receiver at the answering end is required. For bi-directional communication, a receiver and transmitter at each end is required. A combined transmitter and receiver is called a transceiver.

In typical high volume applications, it is now standard practice to fabricate the receiver circuitry and transmitter driver in a single integrated circuit (IC) to produce a transceiver IC. In turn, a transceiver IC, infrared photodiode and LED along with lenses for the photodiode and LED are assembled together in a plastic molded package designed to be small in size and allow placement in the incorporating electronic device so as to have a wide angle of view (typically through an infrared window on its case). The transceiver IC is designed to digitally interface to some type of serial data communications device such as an Infrared Communication Controller (ICC), UART, USART, or a microprocessor performing the same function.

A representative example of a conventional infrared data transmitter and receiver pair is shown in FIG. 1. Infrared transmitter 10 includes LED 16 which generates a modulated infrared pulse in response to transistor 14 being driven by the data signal input at $D_{IN}$ through inverter 12. The modulated infrared signal is optically coupled to an infrared detector, such as photodiode 24 normally operated in current mode (versus voltage mode) producing an output current which is a linear analog of the optical infrared signal falling on it. Current is provided to photodiode 24 through resistor 22 from power supply $V_{DD}$. The infrared pulses generated by LED 16 strike photodiode 24 causing it to conduct current responsive to the data signal input at $D_{IN}$ thereby generating a data signal received at $D_{IR}$.

In receiver 20, the signal received at $D_{IR}$ is input to an inverting input terminal of amplifier 26 and transformed into a voltage signal $V_{IR}$ and amplified by amplifier 26 to produce amplified signal $V_{AS}$. A positive input terminal of amplifier 26 is coupled to power supply $V_{DD}$ through resistor 25. The signal output from amplifier 26 then feeds into comparator 42 which demodulates the received signal by comparing it to a detection threshold voltage $V_{DET}$ in order to produce a digital output data signal at $D_{OUT}$.

The received signal waveform will have edges with slope and will often include a superimposed noise signal. As a result, $V_{DET}$ is ideally placed at the center of the received signal waveform so that the output data signal has a consistent waveform width despite the slope of the received signal edges. Also, placing $V_{DET}$ at the center of the received signal improves the noise immunity of receiver 20 because the voltage difference between $V_{DET}$ and both the high and low levels of the received signal is maximized such that noise peaks are less likely to result in spurious transitions in $D_{OUT}$.

The received signal, however, can vary in amplitude by several orders of magnitude due primarily to variations in the distance between transmitter 10 and receiver 20. The strength of the received signal decreases proportional to the square of the distance. Depending on the range and intensity of the infrared transmitter, the photodiode outputs signal current in the range of 5 na to 5 ma. plus DC and AC currents arising from ambient infrared sources of sunlight, incandescent and fluorescent lighting. As a consequence, the center of the received signal waveform will vary, whereas $V_{DET}$ must generally be maintained at a constant level. To address this problem, receivers typically include an automatic gain control mechanism to adjust the gain responsive to the received signal amplitude. The received signal is fed to AGC peak detector 36 which amplifies the signal and drives current through diode 32 into capacitor 28 when the signal exceeds the AGC threshold voltage $V_{AGC}$ in order to generate a gain control signal. The gain control signal increases in response to increasing signal strength and correspondingly reduces the gain of amplifier 26 so that the amplitude of the received signal at the output of amplifier 26 remains relatively constant despite variations in received signal strength. An inverting input of AGC peak detector 36 is coupled to $V_{AGC}$ through resistor 44 and to diode 32 through resistor 38. Resistor 30 is connected in parallel to capacitor 28.

Because there is ramping on the received waveform $V_{IR}$, which can cause widening or narrowing of the signal pulse unless the detect threshold $V_{DET}$ is in the center of the waveform, AGC improves the fidelity of the output pulse by maintaining $V_{DET}$ at the center of the waveform. However, some communications protocols, such as 4 PPM discussed below, require very precise output pulse width for encoding data which the AGC circuit may be unable to maintain.

At a minimum, infrared receiver 20 amplifies the photodetector signal current and then level detects or demodulates the signal when it rises above the detect threshold $V_{DET}$ thereby producing a digital output pulse at $D_{OUT}$. For improved performance, the receiver may also perform the added functions of blocking or correcting DC and low frequency AC ambient (1–300 ua) signals and Automatic Gain Control (AGC) which improves both noise immunity and minimizes output pulse width variation with signal strength.

Data can be modulated on the infrared transmitted signal by a number of well known methods. One popular method is defined by the Infrared Data Association (IrDA). IrDA Physical Layer Link Specification 1.1e specifies two main physical layer infrared modulation methods. One method is a low-speed (2 Kbp/s to 1.15 Mbp/s) on-off infrared carrier asynchronous modulation where the presence of a pulse indicates a 0 bit and the absence of a pulse indicates a 1 bit. The second method is a high speed (4 Mb/s) synchronous Four Pulse Position Modulation (4 PPM) method in which the time position of a 125 ns infrared pulse in a 500 ns frame encodes two bits of information.

4 PPM is a useful synchronous communication protocol for high speed infrared communications. The two bit per symbol encoding technique of 4 PPM has several advantages over simpler one bit per symbol protocols. One of these advantages is that the protocol allows a minimum pulse width of 125 ns which is at least twice the value of a one pulse per bit protocol of the same speed. The wider pulse is more desirable because it allows the use of lower speed components, such as infrared LEDs, infrared photodiodes, LED transmits drives and receiver circuits, which are less expensive.

However, despite the benefits of 4 PPM, the demodulation process for the protocol is very sensitive to pulse distortion. If the pulse distortion at the receiver output is excessive, then the demodulating Infrared Communications Controller (ICC) may not be able to correctly determine the pulse position which results in bit errors. It is therefore desirable that the output pulse distortion be significantly less than the minimum system requirement to reduce bit errors and improve receiver bit error immunity to noise.

There are two types of pulse position distortion. One is data dependent distortion which is due to intersymbol interference and can typically be minimized by use of sufficient total data bandwidth from transmitter to receiver and filter design to minimize pulse overshoot and ringing.

The second type is systematic pulse bias or pulse width distortion caused by asymmetric pulse response effects or bias errors in components and circuits in the transmit and receive paths. An example of how systematic pulse bias is introduced is when transmit infrared LED 16 has turn-on and turn-off times that are significantly different. In addition, receiver photodiode 24 typically has a turn-off time that is significantly longer than its turn-on time and this effect may vary significantly with the irradiated signal level. FIG. 2B illustrates pulse width widening due to slow transmit LED or photodiode turn-off. The signal $V_{IR}$ received at receiver input terminal $D_{IR}$ has an elongated trailing edge which widens the width of the low-going pulse in the digital output signal $V_{out}$ appearing at the output terminal $D_{OUT}$ of receiver 20 relative to the idealized pulse train illustrated in FIG. 2A.

Also, the receiver amplifier can variably widen the output pulses produced in response to an input signal depending upon such factors as the input signal level, the DC ambient level, receive pulse shape, supply voltage, output load capacitance, and feedback from the output to the input. FIGS. 2C and 2D illustrate the effect of a high and low amplitude levels, respectively, for $V_{AS}$. In FIG. 2C, the high input signal amplitude causes $V_{AS}$ to reach the detection threshold $V_{DET}$ sooner on the rising edge and later on the falling edge resulting in a wider low-going pulse width in $V_{OUT}$. Conversely, a low input signal level causes $V_{AS}$ to reach $V_{DET}$ later on the rising edge and sooner on the falling edge resulting in a narrower low-going pulse width in $V_{OUT}$. Furthermore, all the effects described above are also subject to variation in response to operating temperature fluctuations.

Therefore, the need remains for an infrared receiver which automatically corrects the output pulse width in order to remove systematic pulse bias.

SUMMARY OF THE INVENTION

The present invention relates to a pulse width error correction circuit having a variable delay mechanism controlled by a control signal which allows the temporal position of each edge of an output signal to be individually adjusted, an error integrator amplifier which amplifies the control signal, a reference voltage which sets the duty cycle of the output signal and a lowpass network connected to an analog of the output pulse and which provides an average voltage value of the output pulse to the error integrator amplifier such that the duty cycle of the output pulse is automatically corrected to the duty cycle corresponding to the reference voltage.

One embodiment of the present invention is an output signal pulse width error correction circuit having an input terminal for receiving an input signal from a receiver circuit, an output terminal, a low-pass filter configured to receive the input signal and produce a ramped signal having sloped edges responsive thereto, a variable pulse width comparator interposed between the low-pass filter and the circuit output terminal, the variable pulse width comparator being configured to compare the ramped signal to a pulse width control voltage and produce a digital output signal at the circuit output terminal responsive thereto, and an error integrator amplifier coupled to the output terminal and configured to integrate the digital output signal to obtain an average voltage of the digital output signal, compare the average voltage to a pulse width reference voltage and produce the pulse width control voltage responsive thereto.

Another embodiment of the present invention is a pulse width error correction circuit configured to error correct a data output signal having a transconductance amplifier configured to receive an amplified input signal and, responsive thereto, output a modulated current signal, an error transconductance amplifier configured to receive the data output signal and a duty cycle reference voltage and, responsive to a difference between the data output signal and the duty cycle reference voltage, output an error current signal, a variable delay circuit configured to receive the modulated current signal and the error current signal, wherein the variable delay circuit is further configured to shift a DC level of the modulated current signal responsive to the error current signal in order to produce a level shifted modulated current signal, and wherein the variable delay circuit is further configured to compare the level shifted modulated current signal to a reference voltage in order to generate the data output signal.

The present invention also relates to a method for correcting output signal errors automatically by adjusting the width of output pulses so as to reduce or eliminate pulse width distortion in devices receiving four pulse position modulation signals conforming to a communication protocol having a fixed duty cycle.

An embodiment of the method for error correcting an output data signal generated in response to an input data signal according to the present invention involves generating a duty cycle reference voltage corresponding to a prescribed duty cycle of the output data signal, comparing the input data signal to a pulse width control voltage to produce the output data signal, integrating the output data signal to obtain an average voltage corresponding to a duty cycle of the output data signal, and comparing the average voltage and the pulse width reference voltage in order to produce the pulse width control voltage.

DETAILED DESCRIPTION OF THE PRESENT INVENTION

Figure 3:
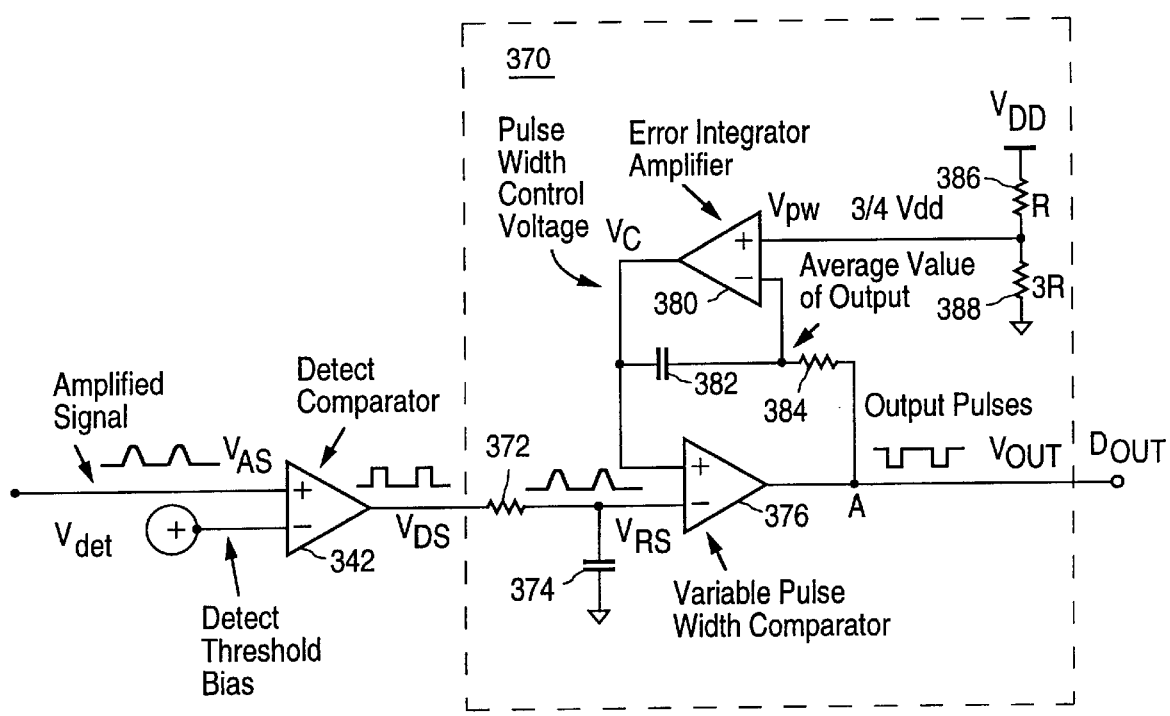
FIG. 3 is a simplified circuit diagram of an embodiment of a pulse width error correction circuit according to the present invention.

FIG. 3 illustrates an output signal pulse width error correction circuit 370 designed to error correct a digital output signal $V_{out}$ by normalizing the duty cycle of the output signal such that the digital output signal conforms to the requirements of a communications protocol.

Figure 1:
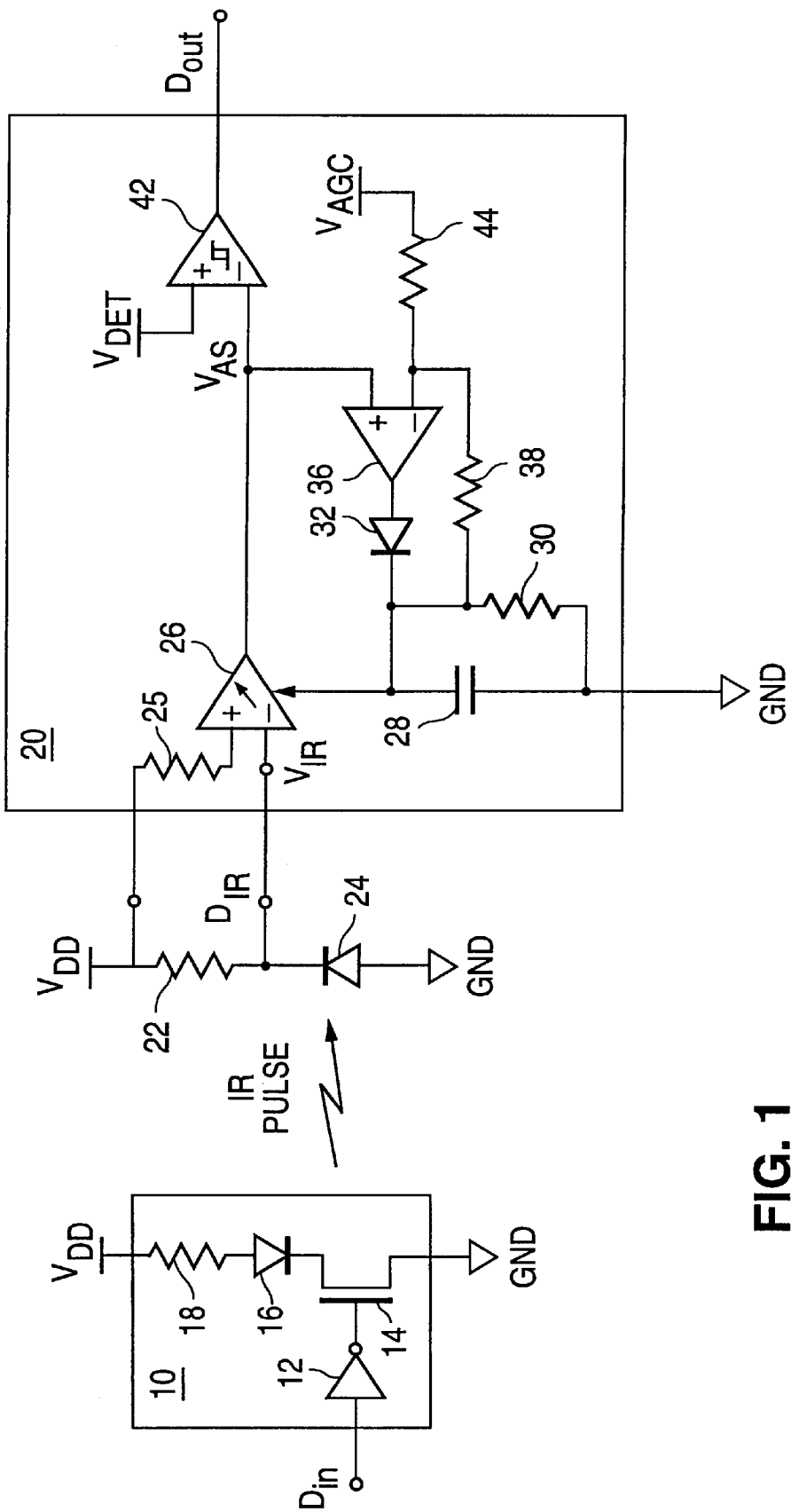
FIG. 1 is a circuit diagram of a conventional infrared transmitter receiver pair.
Figure 2A:
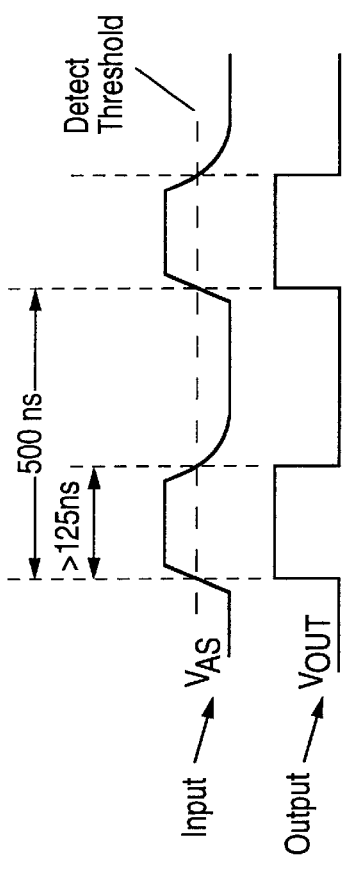
FIGS. 2A–D are waveform diagrams illustrating the effects of pulse width distortion in a conventional infrared receiver.
Figure 2B:
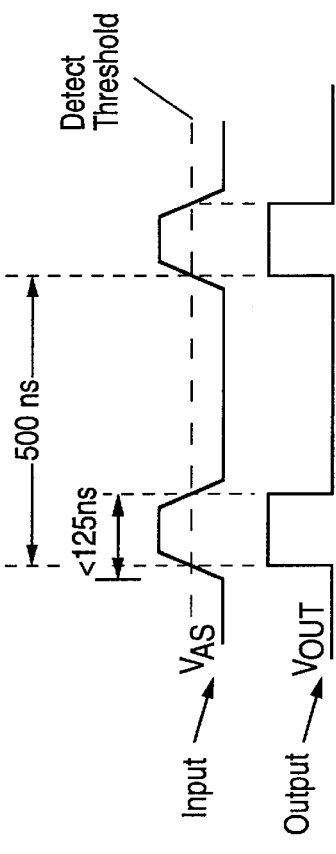
Figure 2C:
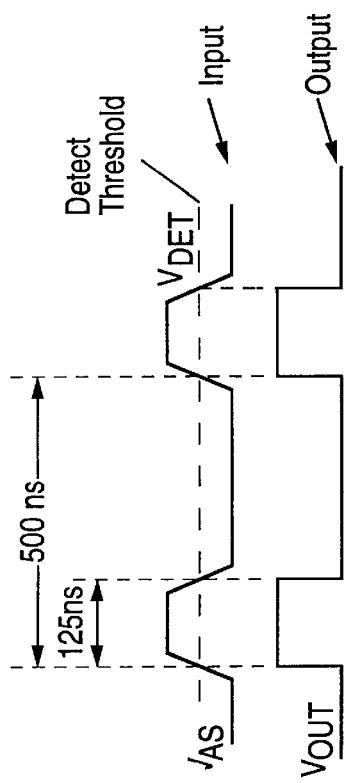
Figure 2D:
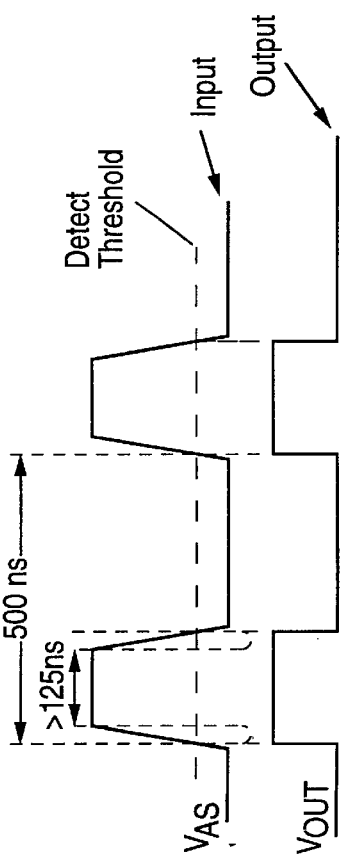

Amplified signal $V_{AS}$, generated in response to Input signal $V_{IR}$ received at input terminal $D_{IR}$ of a receiver, such as receiver 20 of FIG. 1, is amplified and filtered to produce amplified signal $V_{AS}$ at the positive input terminal of detect comparator 342, which is identical to detect comparator 42 of FIG. 1 except that the signals input to the positive and negative terminals are reversed. Detect comparator 342 compares the received signal to detection threshold voltage $V_{DET}$ applied to its negative input terminal in order to generate a digital signal $V_{DS}$ at its output terminal.

$V_{DS}$ is then low pass filtered to produce a ramped signal $V_{RS}$, which has greater slope to the edges of its pulses than the edges of $V_{DS}$, which is input to the negative input terminal of variable pulse width comparator 376. Digital output signal $V_{OUT}$, which is inverted relative to $V_{RS}$, is produced at the output terminal of variable pulse width comparator 376 and output to output terminal $D_{OUT}$ of receiver 20 and also fed back to error integrator amplifier 380. Along with resistor 384 and capacitor 382, error integrator amplifier 380 integrates the average value of the $V_{OUT}$ which corresponds to the duty cycle of the digital output signal. Variable pulse width comparator 376 compares the average value of $V_{OUT}$ to pulse width reference voltage $V_{PW}$ and, in response, outputs pulse width control voltage $V_C$.

$V_{PW}$, as shown in the embodiment of FIG. 3, is $3/4 V_{DD}$ which is obtained from the simple resistive divider network formed by resistors 386 and 388, wherein the resistance of resistor 388 is three times that of resistor 386. This ratio produces a value for $V_{PW}$ that corresponds to a digital output signal duty cycle of 3/4, the duty cycle required by the IrDA 4 PPM communications protocol. Other duty cycles can be obtained by similar adjustment of $V_{PW}$ through resistor value ratios.

Figure 4:
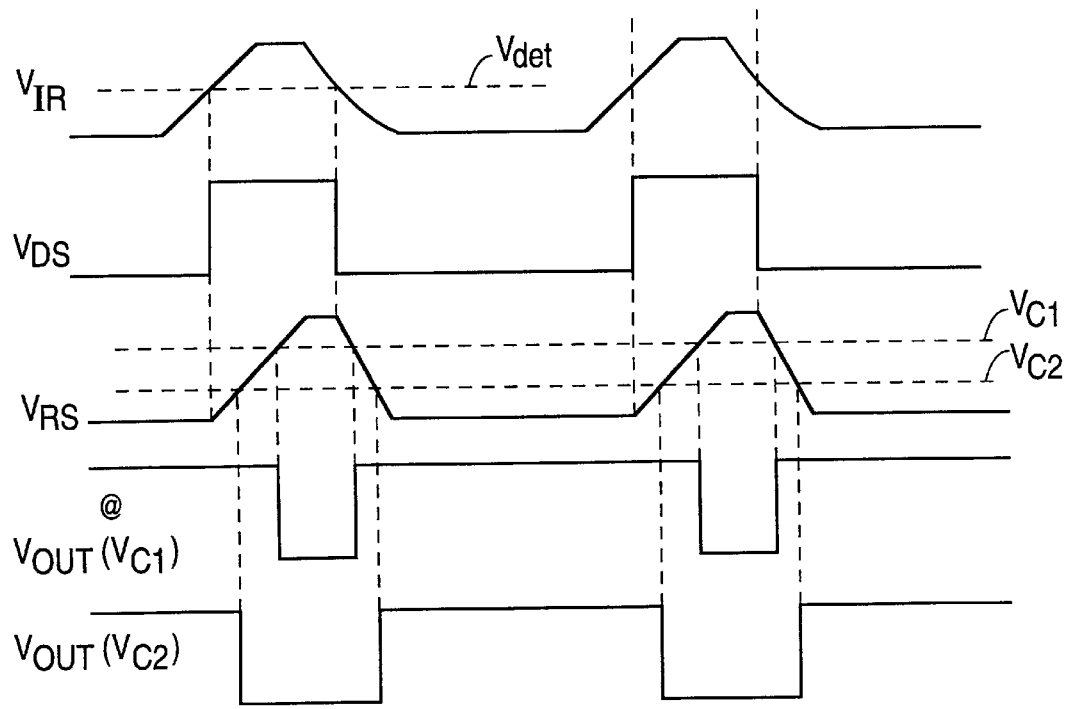
FIG. 4 is a waveform diagram illustrating the pulse width control function of the receiver of FIG. 3.

The introduction of greater slope to $V_{RS}$ permits the pulse width to be controlled by varying the pulse width control voltage $V_C$. $V_C$ will vary inversely with the duty cycle of $V_{OUT}$. As the duty cycle of the digital output signal rises, $V_C$ will decrease causing the output of variable pulse width comparator 376 to transition at a lower voltage level point on the slope of the edges of $V_{RS}$. As a consequence, the low going pulses in $V_{OUT}$ are widened thereby reducing the duty cycle, as illustrated by the waveform $V_{OUT}(V_{C1})$ in FIG. 4. Similarly, when the duty cycle of $V_{OUT}$ falls, $V_C$ will increase causing the output of variable pulse width comparator 376 to transition at a higher voltage level point on the slope of the edges of $V_{RS}$ causing the low going pulses in the digital output signal to narrow and thus increasing the duty cycle, as illustrated by the waveform $V_{OUT}(V_{C2})$ in FIG. 4. The output signal pulse width error correction circuit 370 therefore produces an output signal at $D_{OUT}$ that conforms to the requirements of the 4 PPM communications protocol.

Figure 5:
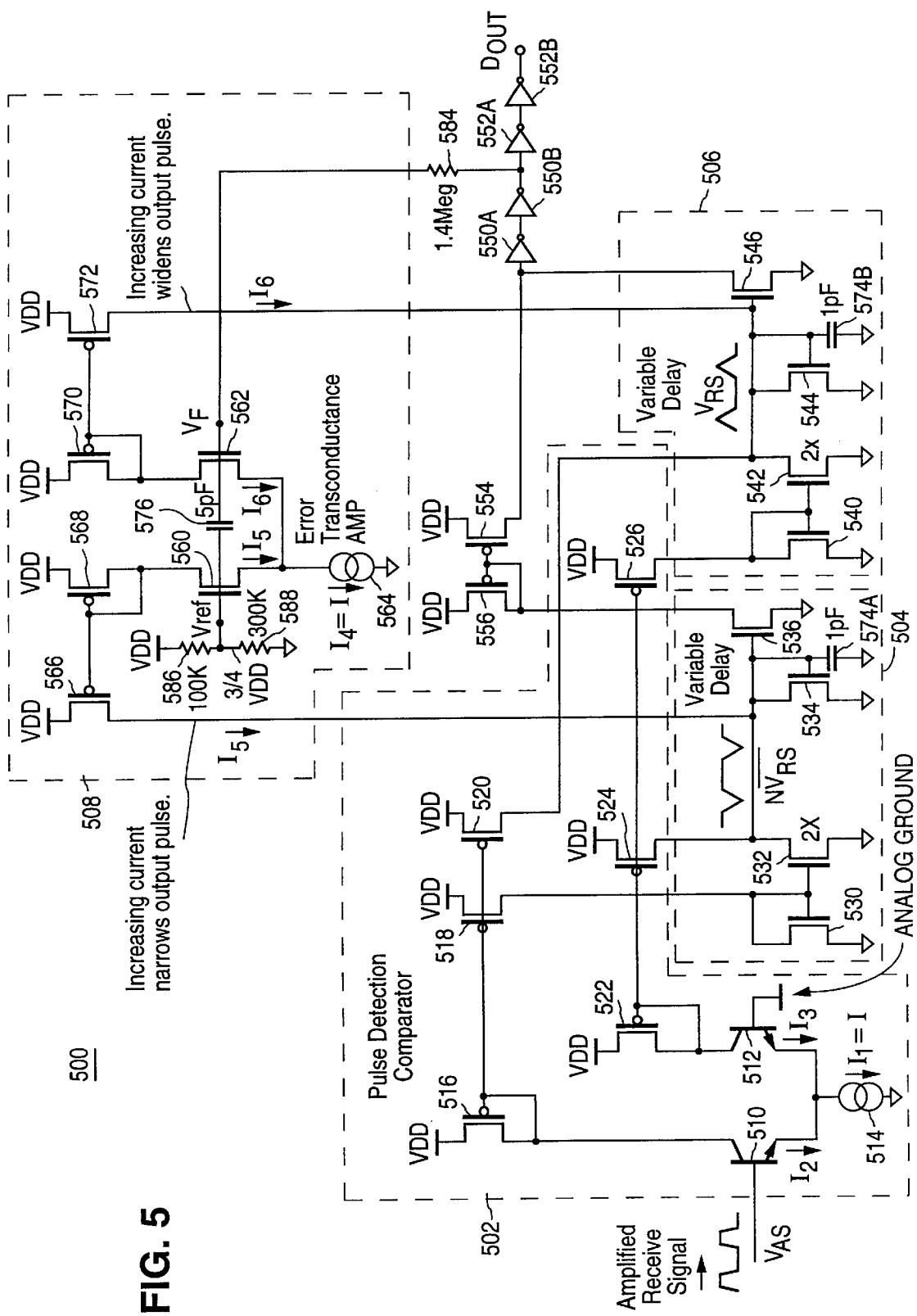
FIG. 5 is a detailed circuit diagram of another embodiment of a pulse width error correction circuit according to the present invention.

FIG. 5 is a detailed circuit diagram of another embodiment of a pulse width error correction circuit 500 according to the present invention for an integrated circuit implementation. Pulse width error correction circuit 500 is a BiCMOS implementation that utilizes fewer transistors that are smaller in size and yields better performance when fabricated in an integrated circuit. The complementary approach of pulse width error correction circuit 500 accommodates the asymmetric performance of the active devices for a given technology, for example, NMOS devices tend to draw more current than equally proportioned PMOS devices.

Also, integrated circuit implementations typically utilize current mirrors, which can only sink or source current, leading to unipolar function. By using two signal current paths that are 180° out of phase with one another, bipolar, or push-pull performance, where the signal swings from near the potential of one power supply rail to near the potential of the other supply rail, can be obtained for signal processing with the use of current mirrors. Another performance advantage is that pulse width error correction circuit 500 will continue to operate even when $V_{DD}$ drops as low as 2 volts.

Pulse width error correction circuit 500 includes NMOS transistors 510 and 512, current source 514, and PMOS transistors 516, 518, 520, 522, 524 and 526 which together form a transconductance amplifier 502 which receives the amplified received voltage signal $V_{AS}$ from an input amplifier, such as amp 26 in FIG. 1, and outputs corresponding positive and negative current signals. Current source 514 sinks a current $I_1$ having a constant magnitude I, which splits into current $I_2$, which runs through transistor 510, and current $I_3$, which runs through transistor 512. Transistor 510 modulates $I_2$ responsive to $V_{AS}$ at its gate terminal which, since $I_1$ remains constant at magnitude I and transistor 512 is gated by an analog ground potential (which also remains constant), causes a complementary modulation of $I_3$. $I_2$ is therefore a noninverted modulated current signal, relative to $V_{AS}$ and $I_3$ is an inverted modulated current signal.

Modulated current signal $I_2$ also flows through diode connected PMOS transistor 516 wherein the gate of transistor 516 is coupled to the gates of transistors 518 and 520 to form a current mirror configuration. Consequently, because transistors 518 and 520 are the same size as transistor 516, $I_2$ flows in transistors 518 and 520 which each constitute a noninverted current output for transconductance amp 502.

Inverse modulated current signal $I_3$ flows in diode connected PMOS transistor 522 wherein the gate of transistor 522 ic coupled to the gates of transistors 524 and 526 to form a current mirror configuration. Transistors 522, 524 and 526 are the same size, therefore $I_3$ flows in each of transistor 524 and 526 which each constitute an inverted current output for transconductance amp 502.

NMOS transistors 530, 532, 534 and 536, along with 1 picoFarad (pF) capacitor 574A, form a first variable delay circuit 504. NMOS transistors 540, 542, 544 and 546, along with 1 pF capacitor 574B, form a second variable delay circuit 506. Variable delay circuit 504 receives $I_2$ from the source of transistor 518 which is coupled to the drain of diode connected NMOS transistor 530, which functions as an inverting input to the first variable delay circuit 504, so that $I_2$ flows in transistor 530. The gate of transistor 530 is coupled to the gate of transistor 532 to form a current mirror configuration. However, because transistor 532 is twice the size of transistor 530, the current flowing in transistor 532 has a magnitude that is twice that of $I_2$, i.e. $2 \times I_2$. Variable delay circuit 504 also receives the inverted modulated current $I_3$ from the source of transistor 524 which is coupled to the drain of transistor 532, which functions as a noninverting input to the first variable delay circuit 504. Therefore, push-pull performance is obtained for the current present at the junction between the drain of transistor 532 and the source of transistor 524 and which is integrated by capacitor 574A to produce voltage signal $NV_{RS}$. The drain and gate terminals of transistor 534 are connected to capacitor 574A so as to diode connect transistor 534 and clamp the maximum voltage level of $NV_{RS}$. $NV_{RS}$ drives NMOS transistor 536 thereby generating a corresponding current in current mirror transistors 554 and 556, which effectively invert $NV_{RS}$, whereby the signal modulations from $V_{AS}$ arrive at the input of inverter 550A and then pass through inverter 550B, whereby inverters 550A and 550B act as a buffer, for output of the data signal to $D_{out}$ through inverters 552A and 552B, which also buffer the signal modulations.

Similarly, variable delay circuit 506 receives $I_3$ from the source of transistor 526 which is coupled to the drain of diode connected NMOS transistor 540, which functions as an inverting input to the second variable delay circuit 506, so that $I_3$ flows in transistor 540. The gate of transistor 540 is coupled to the gate of transistor 542 to form a current mirror configuration. However, because transistor 542 is twice the size of transistor 540, the current flowing in transistor 542 has a magnitude that is twice that of $I_3$, i.e. $2 \times I_3$. Variable delay circuit 506 also receives the noninverted modulated current $I_2$ from the source of transistor 520 which is coupled to the drain of transistor 542, which functions as an noninverting input to the second variable delay circuit 506. Therefore, push-pull performance is obtained for the current present at the junction between the drain of transistor 542 and the source of transistor 520 and which is integrated by capacitor 574B to produce voltage signal $V_{RS}$. The drain and gate terminals of transistor 544 are connected to capacitor 574B so as to diode connect transistor 544 and clamp the maximum voltage level of $V_{RS}$. $V_{RS}$ drives transistor 546 whereby the signal modulations from $V_{AS}$ arrive, through a second path, at the input of inverter 550A. In effect, the turn-on voltage of transistors 536 and 546 is the reference voltage for digitizing Vrs and NVrs in order to produce a digital signal at $D_{out}$.

By driving capacitors 574A and 574B with current instead of voltage, it is not necessary to use large MOSFET devices or low impedance drivers while the maximum voltages on the capacitors are also clamped by the current mirrors. Using current mirrors to clamp the maximum voltage on capacitors 574A and 574B also has the effect of making the performance of variable delay circuits 504 and 506 independent of the voltage level of $V_{DD}$ because the slope of the signal edges in $V_{RS}$ and $NV_{RS}$ remain constant because of the use of a constant current source to charge and discharge the capacitors.

Error transconductance amp 508 monitors the data output signal present at $D_{out}$ which is input into amp 508 through feedback resistor 584 (1.4MΩ) coupled to the gate of transistor 560. The gate of transistor 562 is coupled to the junction of resistors 586 and 588 which are coupled in series between $V_{DD}$ and ground to generate a voltage level corresponding to the predetermined correct duty cycle for the output signal under the given communications protocol. In the example shown in FIG. 5, resistor 586 is 100 kΩ and resistor 588 is 300 kΩ the ratio of which produce a voltage corresponding to the 75% duty cycle for the 4 PPM communications protocol. Capacitor 576 (5 pF) is coupled between the gates of transistors 560 and 562 to integrate the feedback signal at the gate terminal of transistor 560 for comparison to the duty cycle reference voltage.

Current source 564 sources a constant current $I_4$ having magnitude I which is split between current $I_5$ in transistor 560 and current $I_6$ in transistor 562. As a result, the difference between the feedback signal and the duty cycle reference signal will produce complementary modulation in currents $I_5$ and $I_6$. Transistor 560 is coupled to diode connected PMOS transistor 568, which is connected in a current mirror configuration with transistor 566, so that $I_5$ also flows in transistors 566 and 568. The source of transistor 566 therefore acts as a non-inverted current output for error transconductance amp 508 which outputs a non-inverted current signal ($I_5$) corresponding to the error detected between the feedback signal $V_F$ and the duty cycle reference voltage $V_{ref}$.

Transistor 562 is coupled to diode connected PMOS transistor 570, which is connected in a current mirror configuration with transistor 572, so that $I_6$ also flows in transistors 570 and 572. The source of transistor 572 therefore acts as an inverted current output terminal for error transconductance amp 508 which outputs an inverted current signal ($I_6$) corresponding to the error detected between the feedback signal and the duty cycle reference voltage.

When the duty cycle of the output signal at $D_{out}$ is above the duty cycle prescribed by the duty cycle reference voltage $V_{ref}$, then $I_5$ increases in magnitude and charges capacitor 574A in order to raise the DC level of $NV_{RS}$. Simultaneously, $I_6$ decreases in magnitude and discharges capacitor 574B in order to lower the DC level of $V_{RS}$. The result is that the width of the pulses in the output signal are decreased until the feedback signal matches the reference signal.

Similarly, if the duty cycle of the output signal at $D_{out}$ is below the duty cycle prescribed by the duty cycle reference voltage $V_{ref}$, then $I_5$ decreases in magnitude and discharges capacitor 574A in order to lower the DC level of $NV_{RS}$. Simultaneously, $I_6$ increases in magnitude and charges capacitor 574B in order to raise the DC level of $V_{RS}$. The result is that the width of the pulses in the output signal increases until the feedback signal matches the reference signal.

At stasis, the currents driving capacitors 574A and 574B will be balanced because transistors 532 and 542 are twice the size of the other transistors and therefore sink twice the current. Therefore, the current sunk by transistor 532, for example, will be balanced by the current sourced by transistors 524 and 566.

Having illustrated and described the principles of the present invention in the context of the embodiments described above, it should be readily apparent to those skilled in the art that the invention can be modified in arrangement and detail without departing from such principles. For example, while the present invention is described above in the context of an infrared receiver, it should be readily understood that the present invention is applicable to other signal receivers without departing from the scope and spirit of the present invention.

I claim:

1. An output signal pulse width error correction circuit comprising:

a circuit input terminal for receiving an input signal from a receiver circuit;

a circuit output terminal;

a low-pass filter coupled to the circuit input terminal and configured to receive the input signal and produce a ramped signal having sloped edges responsive thereto;

a variable pulse width comparator interposed between the low-pass filter and the circuit output terminal, the variable pulse width comparator being configured to compare the ramped signal to a pulse width control voltage and produce a digital output signal at the circuit output terminal responsive thereto; and an error integrator amplifier coupled to the circuit output terminal and configured to integrate the digital output signal to obtain an average voltage of the digital output signal, compare the average voltage to a pulse width reference voltage and produce the pulse width control voltage responsive thereto.

2. The output signal pulse width error correction circuit of claim 1, wherein the pulse width reference voltage is obtained from a resistive divider network, the resistor divider network comprising first and second resistors configured to be coupled in series between a source voltage and a ground voltage, wherein a ratio of the resistance values of the first and second resistors determines the pulse width reference voltage at a common node between the first and second resistors.

3. The output signal pulse width error correction circuit of claim 1, wherein the error integrator amplifier comprises:

negative and positive input terminals and an output terminal;

a resistor coupled between the negative input terminal and the circuit output terminal;

a capacitor coupled between the negative input terminal of the error integrator amplifier and the output terminal of the error integrator amplifier; and wherein the positive input terminal of the error integrator amplifier is configured to receive the pulse width reference voltage, and wherein the pulse width control voltage is generated at the output terminal of the error integrator amplifier.

4. The output signal pulse width error correction circuit of claim 1, wherein the variable pulse width comparator comprises negative and positive input terminals and an output terminal, wherein;

the negative input terminal of the variable pulse width comparator is configured to receive the ramped signal;

the positive input terminal of the variable pulse width comparator is configured to receive the pulse width control voltage; and the digital output signal is generated at the output terminal of the variable pulse width comparator responsive to the ramped signal and the pulse width control voltage.

5. A method for error correcting an output data signal generated in response to an input data signal, the method comprising the steps:

generating a duty cycle reference voltage corresponding to a prescribed duty cycle of the output data signal;

comparing the input data signal to a pulse width control voltage to produce the output data signal;

integrating the output data signal to obtain an average voltage corresponding to a duty cycle of the output data signal; and comparing the average voltage and a pulse width reference voltage in order to produce the pulse width control voltage.

6. The method of claim 5, including the step of low-pass filtering the input data signal to introduce greater slope to signal edges of the input data signal.

7. The method of claim 5, including the step of converting the input data signal to a current signal.

* * * * *